US012142402B2

(12) United States Patent
Wang et al.

(10) Patent No.: US 12,142,402 B2
(45) Date of Patent: Nov. 12, 2024

(54) MONOLITHIC SURFACE MOUNT PASSIVE COMPONENT

(71) Applicant: Western Digital Technologies, Inc., San Jose, CA (US)

(72) Inventors: Ai-Wen Wang, Taichung (TW); Wei-Chun Shen, Taichung (TW); Yu-Mei Chen, Taichung (TW); Guiyang Jiang, Shanghai (CN)

(73) Assignee: Sandisk Technologies, Inc., Milpitas, CA (US)

( * ) Notice: Subject to any disclaimer, the term of this patent is extended or adjusted under 35 U.S.C. 154(b) by 195 days.

(21) Appl. No.: 17/344,350

(22) Filed: Jun. 10, 2021

(65) Prior Publication Data

US 2022/0399306 A1   Dec. 15, 2022

(51) Int. Cl.
*H01C 17/065*   (2006.01)
*H01C 17/28*   (2006.01)
(Continued)

(52) U.S. Cl.
CPC ......... *H01C 17/281* (2013.01); *H01C 17/065* (2013.01); *H01L 24/01* (2013.01);
(Continued)

(58) Field of Classification Search
CPC ..... H01L 25/0652; H01L 24/01; H01L 24/80; H01L 2924/1431; H01L 2924/1438; H01L 2924/19011; H01L 2924/19043; H01L 2924/19105; H01L 2924/19041; H01L 2924/19042; H01L 2924/19101;
(Continued)

(56) References Cited

U.S. PATENT DOCUMENTS 9,565,765 B2   2/2017 Song
10,177,714 B1 *  1/2019 Mclaren ................. H03F 1/083
(Continued)

FOREIGN PATENT DOCUMENTS

CN    106455306 A    2/2017
JP     11103229 A  *  4/1999

OTHER PUBLICATIONS

Ostfeld, A. E. et al. Screen printed passive components for flexible power electronics. Sci. Rep. 5, 15959; doi: 10.1038/srep15959 (2015). (Year: 2015).*

*Primary Examiner* — Shaun M Campbell
*Assistant Examiner* — Teresa M. Arroyo
(74) *Attorney, Agent, or Firm* — Michael Best & Friedrich LLP

(57) ABSTRACT

A data storage device includes a substrate including a number of contact pads and a number of passive component packages coupled to the contact pads. The data storage device further includes a memory controller coupled to the substrate, and one or more NAND die stacks coupled to the substrate and in electrical communication with the memory controller. One or more of the passive component packages include a first passive component, a second passive component electrically connected to the first passive component, and a first terminal coupled to the first passive component. The passive component packages further include a second terminal coupled to the second passive component, and a third terminal coupled to a common node of the first passive component and the second passive component.

5 Claims, 6 Drawing Sheets

(51) Int. Cl.
*H01L 23/00* (2006.01)
*H01L 25/065* (2023.01)
*H10B 41/35* (2023.01)
*H10B 43/35* (2023.01)

(52) U.S. Cl.
CPC .......... *H01L 24/80* (2013.01); *H01L 25/0652* (2013.01); *H10B 41/35* (2023.02); *H10B 43/35* (2023.02); *H01L 2924/1431* (2013.01); *H01L 2924/1438* (2013.01); *H01L 2924/19011* (2013.01); *H01L 2924/19043* (2013.01); *H01L 2924/19105* (2013.01)

(58) Field of Classification Search
CPC .......... H10B 43/35; H10B 41/35; H01C 1/01; H01C 17/065; H01C 17/281
See application file for complete search history.

(56) References Cited

U.S. PATENT DOCUMENTS

| | | | | |
|---|---|---|---|---|
| 2006/0159899 | A1* | 7/2006 | Edwards et al. | B32B 3/00 |
| | | | | 428/209 |
| 2013/0199027 | A1* | 8/2013 | Singh | H01F 27/2804 |
| | | | | 29/602.1 |
| 2014/0085843 | A1* | 3/2014 | Otsubo | H05K 1/181 |
| | | | | 29/832 |
| 2015/0201495 | A1* | 7/2015 | Kim | H05K 1/0306 |
| | | | | 174/255 |
| 2019/0214353 | A1* | 7/2019 | Haba et al. | H01L 23/66 |
| 2021/0398730 | A1* | 12/2021 | Yoshioka | H01F 41/041 |

* cited by examiner

MONOLITHIC SURFACE MOUNT PASSIVE COMPONENT

BACKGROUND

This application relates generally to surface mount passive components, and more particularly, to a configuration of a surface mount component to allow for multiple passive components to be integrated within a single monolithic package.

The current trend in packaged integrated circuits ("IC"), such as memory devices (for example, SD cards, micro SD cards, USB devices and the like) is to increase component density while also maintaining or reducing packaging size. Passive components, such as resistors, capacitors, and inductors, require substantial space within a packaged IC. Specifically, passive components that have a common connection or signal point still must be separated due to design and manufacturing constraints. By combining passive components into a single package for certain applications, additional space may be achieved resulting in increased component density within a given IC.

SUMMARY

Increases in component density within data storage devices may require an increase in packaging sizes. By combining multiple passive components into a single package, the component density can be increased without a corresponding increase in packaging sizes.

One embodiment of the present disclosure includes a packaged integrated circuit. The packaged integrated circuit includes a substrate which includes a number of contact pads and a number of passive component packages coupled to the contact pads. The packaged integrated circuit further includes a first integrated circuit die coupled to the substrate, and one or more second integrated circuit dies coupled to the substrate and in electrical communication with the first integrated circuit die by way of the substrate. One or more of the passive component packages include a first passive component, a second passive component electrically connected to the first passive component, and a first terminal coupled to the first passive component. The passive component packages further include a second terminal coupled to the second passive component, and a third terminal coupled to a common node of the first passive component and the second passive component.

Another embodiment of the present disclosure includes a method for manufacturing a multiple passive component package. The method includes performing a first printing process to print at least a portion of the passive components of the package on a first layer, and a second printing process to print at least a portion a common terminal between two passive components within the package on the first layer. The method further includes repeating the first printing process and the second printing process for a plurality of layers, and performing a stacking operation to stack the plurality of layers. The method also includes performing a pressing operation to combine the plurality of layers, and separating one or more multiple passive component packages from the combined layers.

Another embodiment of the present disclosure includes a data storage devices having a substrate comprising a number of contact pads and a number of passive component packages coupled to the component pads. The data storage device further includes a memory controller coupled to the substrate, and one or more NAND die stacks coupled to the substrate and in electrical communication with the memory controller. One or more of the passive component packages include a first passive component and a second passive component electrically connected to the first passive component. The passive component packages further include a first terminal coupled to the first passive component, a second terminal coupled to the second passive component, and a third terminal coupled to a common node of the first passive component and the second passive component. The third terminal is positioned equidistant between the first terminal and the second terminal along a longitudinal axis.

Various aspects of the present disclosure provide for improvements in memory devices. For example, increasing component density while maintaining or reducing current packaging dimensions allows for greater performance in smaller packages. The present disclosure can be embodied in various forms. The foregoing summary is intended solely to give a general idea of various aspects of the present disclosure and does not limit the scope of the present disclosure in any way.

DETAILED DESCRIPTION

In the following description, numerous details are set forth, such as data storage device configurations, and the like, in order to provide an understanding of one or more aspects of the present disclosure. It will be readily apparent to one skilled in the art that these specific details are merely exemplary and not intended to limit the scope of this application. The following description is intended solely to give a general idea of various aspects of the present disclosure and does not limit the scope of the disclosure in any way. Furthermore, it will be apparent to those of skill in the art that, although the present disclosure refers to NAND flash, the concepts discussed herein are applicable to other types of solid-state memory, such as NOR, PCM ("Phase Change Memory"), ReRAM, etc. Those of skill in the art also will realize that although the disclosure refers to a substrate used in a data storage device, the disclosure may apply to substrates used in other types of electronic devices. The disclosure applies to both substrates and printed circuit boards used in electronic devices. Further, although specific examples disclose memory devices, it will be understood by those of skill in the art that the inventive concepts disclosed herein may be applied to other types of electronic devices that are assembled using a printed circuit board.

Figure 1:
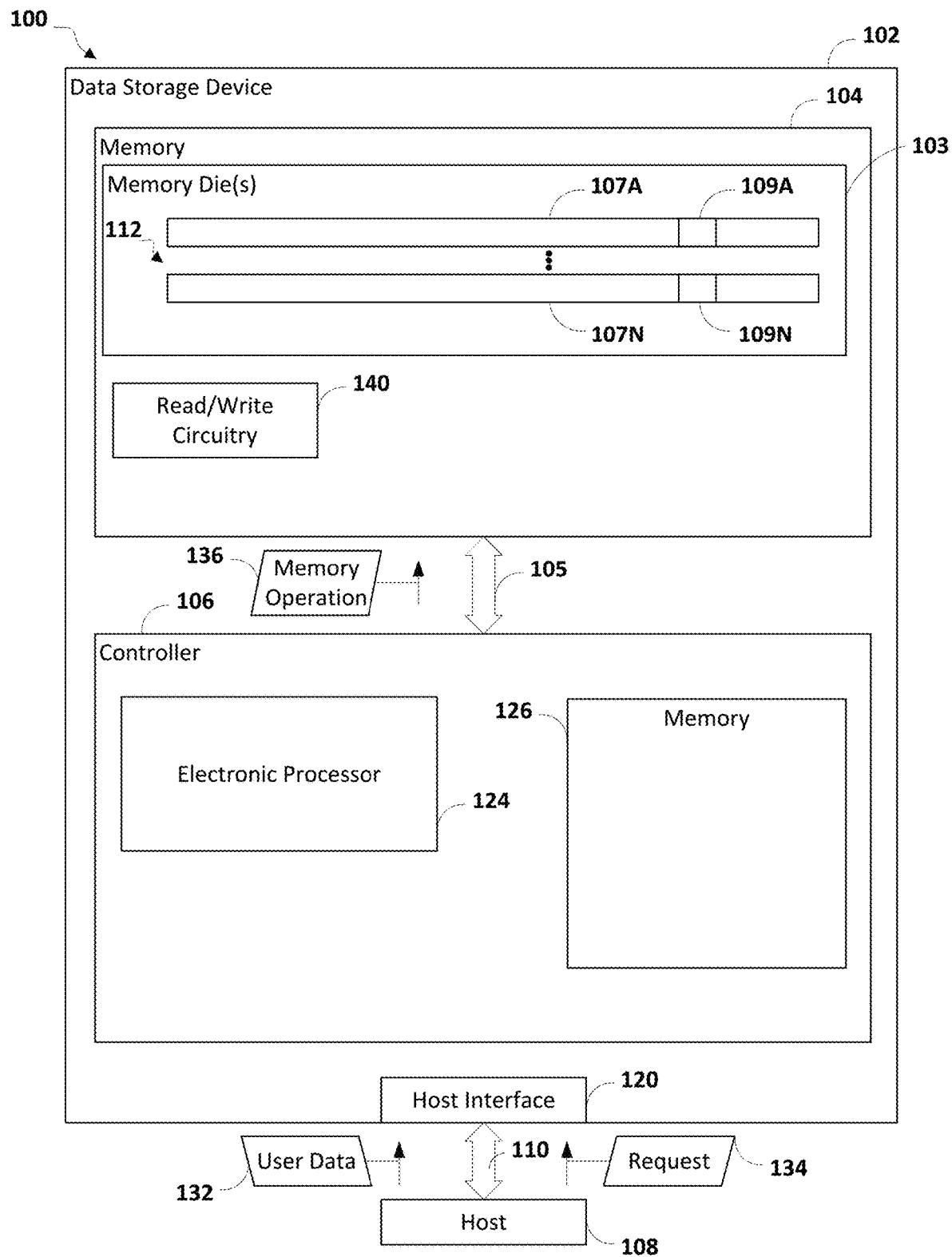
FIG. 1 is block diagram of one example of a system including a data storage device, according to some embodiments.

FIG. 1 is a block diagram of one example of a system 100 that includes a data storage device 102 in communication with a host device 108. The data storage device 102 includes a memory device 104 (e.g., non-volatile memory) that is coupled to a controller 106.

One example of the structural and functional features provided by the controller 106 are illustrated in FIG. 1. However, the controller 106 is not limited to the structural and functional features provided by the controller 106 in FIG. 1. The controller 106 may include fewer or additional structural and functional features that are not illustrated in FIG. 1.

The data storage device 102 and the host device 108 may be operationally coupled with a connection (e.g., a communication path 110), such as a bus or a wireless connection. In some examples, the data storage device 102 may be embedded within the host device 108. Alternatively, in other examples, the data storage device 102 may be removable from the host device 108 (i.e., "removably" coupled to the host device 108). As an example, the data storage device 102 may be removably coupled to the host device 108 in accordance with a removable universal serial bus (USB) configuration. In some implementations, the data storage device 102 may include or correspond to a solid state drive (SSD), which may be used as an embedded storage drive (e.g., a mobile embedded storage drive), an enterprise storage drive (ESD), a client storage device, or a cloud storage drive, or other suitable storage drives.

The data storage device 102 may be configured to be coupled to the host device 108 with the communication path 110, such as a wired communication path and/or a wireless communication path. For example, the data storage device 102 may include an interface 120 (e.g., a host interface) that enables communication with the communication path 110 between the data storage device 102 and the host device 108, such as when the interface 120 is communicatively coupled to the host device 108. In some embodiments, the communication path 110 may include one or more electrical signal contact pads or fingers that provide electrical communication between the data storage device 102 and the host device 108.

The host device 108 may include a processor and a memory. The memory may be configured to store data and/or instructions that may be executable by the processor. The memory may be a single memory or may include one or more memories, such as one or more non-volatile memories, one or more volatile memories, or a combination thereof. The host device 108 may issue one or more commands to the data storage device 102, such as one or more requests to erase data at, read data from, or write data to the memory device 104 of the data storage device 102. For example, the host device 108 may be configured to provide data, such as user data 132, to be stored at the memory device 104 or to request data 134 to be read from the memory device 104. The host device 108 may include a mobile smartphone, a music player, a video player, a gaming console, an electronic book reader, a personal digital assistant (PDA), a computer, such as a laptop computer or notebook computer, any combination thereof, or other suitable electronic device.

The host device 108 communicates with a memory interface that enables reading from the memory device 104 and writing to the memory device 104. In some examples, the host device 108 may operate in compliance with an industry specification, such as a Universal Flash Storage (UFS) Host Controller Interface specification. In other examples, the host device 108 may operate in compliance with one or more other specifications, such as a Secure Digital (SD) Host Controller specification or other suitable industry specification. The host device 108 may also communicate with the memory device 104 in accordance with any other suitable communication protocol.

The memory device 104 of the data storage device 102 may include a non-volatile memory (e.g., NAND, BiCS family of memories, or other suitable memory). In some examples, the memory device 104 may be any type of flash memory. For example, the memory device 104 may be two-dimensional (2D) memory or three-dimensional (3D) flash memory. The memory device 104 may include one or more memory dies 103. Each of the one or more memory dies 103 may include one or more memory blocks 112 (e.g., one or more erase blocks). Each memory block 112 may include one or more groups of storage elements, such as a representative group of storage elements 107A-107N. The group of storage elements 107A-107N may be configured as a wordline. The group of storage elements 107A-107N may include multiple storage elements (e.g., memory cells that are referred to herein as a "string"), such as a representative storage elements 109A and 109N, respectively.

The memory device 104 may include support circuitry, such as read/write circuitry 140 to support operation of the one or more memory dies 103. Although depicted as a single component, the read/write circuitry 140 may be divided into separate components of the memory device 104, such as read circuitry and write circuitry. The read/write circuitry 140 may be external to the one or more memory dies 103 of the memory device 104. Alternatively, one or more individual memory dies may include corresponding read/write circuitry that is operable to read from and/or write to storage elements within the individual memory die independent of any other read and/or write operations at any of the other memory dies.

The controller 106 is coupled to the memory device 104 (e.g., the one or more memory dies 103) with a bus 105, an interface (e.g., interface circuitry), another structure, or a combination thereof. For example, the bus 105 may include multiple distinct channels to enable the controller 106 to communicate with each of the one or more memory dies 103 in parallel with, and independently of, communication with the other memory dies 103.

The controller 106 is configured to receive data and instructions from the host device 108 and to send data to the host device 108. For example, the controller 106 may send data to the host device 108 using the interface 120, and the controller 106 may receive data from the host device 108 with the interface 120. The controller 106 is configured to send data and commands (e.g., the memory operation 136, which may be a cycle operation of a memory block of the memory device 104) to the memory device 104 and to receive data from the memory device 104. For example, the controller 106 is configured to send data and a program or write command to cause the memory device 104 to store data to a specified address of the memory device 104. The write command may specify a physical address of a portion of the memory device 104 (e.g., a physical address of a word line of the memory device 104) that is to store the data.

The controller 106 is configured to send a read command to the memory device 104 to access data from a specified address of the memory device 104. The read command may specify the physical address of a region of the memory device 104 (e.g., a physical address of a word line of the memory device 104). The controller 106 may also be configured to send data and commands to the memory device 104 associated with background scanning operations, garbage collection operations, and/or wear-leveling operations, or other suitable memory operations.

The controller 106 may include a processor 124, a memory 126, and other associated circuitry. The memory 126 may be configured to store data and/or instructions that may be executable by the processor 124.

The controller 106 may send the memory operation 136 (e.g., a read command) to the memory device 104 to cause the read/write circuitry 140 to sense data stored in a storage element. For example, the controller 106 may send the read command to the memory device 104 in response to receiving a request for read access from the host device 108. In response to receiving the read command, the memory device 104 may sense the storage element 107A (e.g., using the read/write circuitry 140) to generate one or more sets of bits representing the stored data.

Generally, the data storage device 102 may include a large quantity of surface mount passive components to perform the functions and/or operations noted above, or may be used to construct, in whole or in part, one or more of the above noted portions of the data storage device 102 described above. As data storage devices advance, the desire to include more and more components and/or functionality into smaller packages increases. However, spacing requirements between components and their associated pads on a circuit board or other substrate often limit the density of components that may be placed within a constrained physical package.

Figure 2:
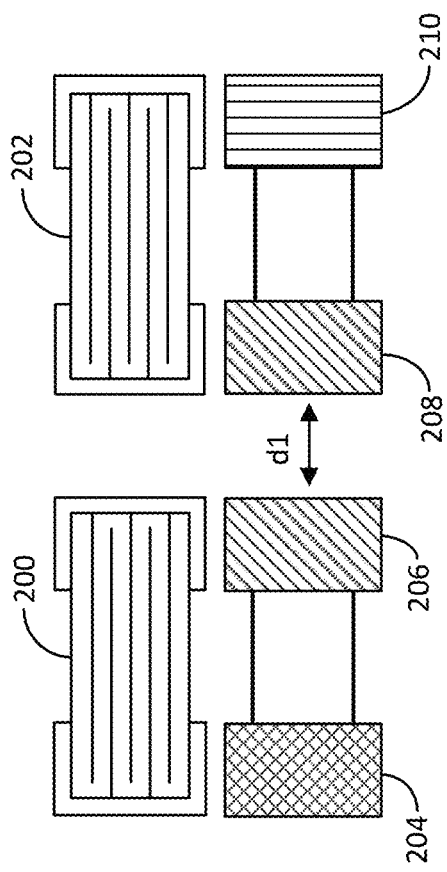
FIG. 2 is a top down view of a typical surface mount passive component, according to some embodiments.

Turning now to FIG. 2, a top down view of typical surface mount passive components 200, 202, is shown, according to some embodiments. In one embodiment, and as will be described in more detail below, the surface mount passive components 200, 202 are resistors. However, other passive components, such as capacitors and/or inductors are also contemplated. The surface mount passive components 200, 202 may generally be placed on conductive pads, such as conductive pads 204, 206, 208, 210, which are located on a printed circuit board or other substrate. In some examples, the printed circuit board or other substrate may be located within a data storage device, such as data storage device 102, described above. The conductive pads 204, 206, 208, 210 may be formed on the printed circuit board or other substrate as generally known in the art. In some examples, the surface mount passive components 200, 202 are coupled to the conductive pads 204, 206, 208, 210 with a solder, such as Silver-Tin solder. However, other solder types, such as silver, gold, etc. are also contemplated. Components pads 212, 214, 216, 218 may be used to form the electrical connection with the conductive pads 204, 206, 208, 210, respectively.

As shown in FIG. 2, a distance, d1, is generally required between components and/or their associated traces to prevent possible interconnection between the components, such as surface mount passive components 200, 202. For example, if the distance d1 is not sufficient, a solder bridge may form between the surface mount passive components 200, 202, and/or conductive pads 206, 208 during the manufacturing process. In some examples, the distance d1 is within a range of 200 µm to 350 µm. However, values of more than 350 µm or less than 200 µm are contemplated. In some examples, the distance d1 may be determined based on one or more characteristics of the signals provided to the surface mount passive components 200, 202, such as voltage level, switching frequency, etc.

Figure 3:
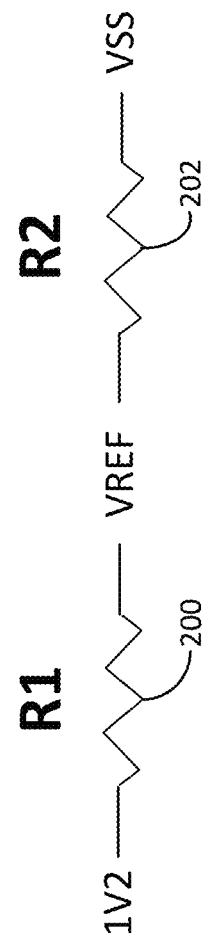
FIG. 3 is a schematic view of the surface mount passive components of FIG. 2, according to some embodiments.
Figure 4:
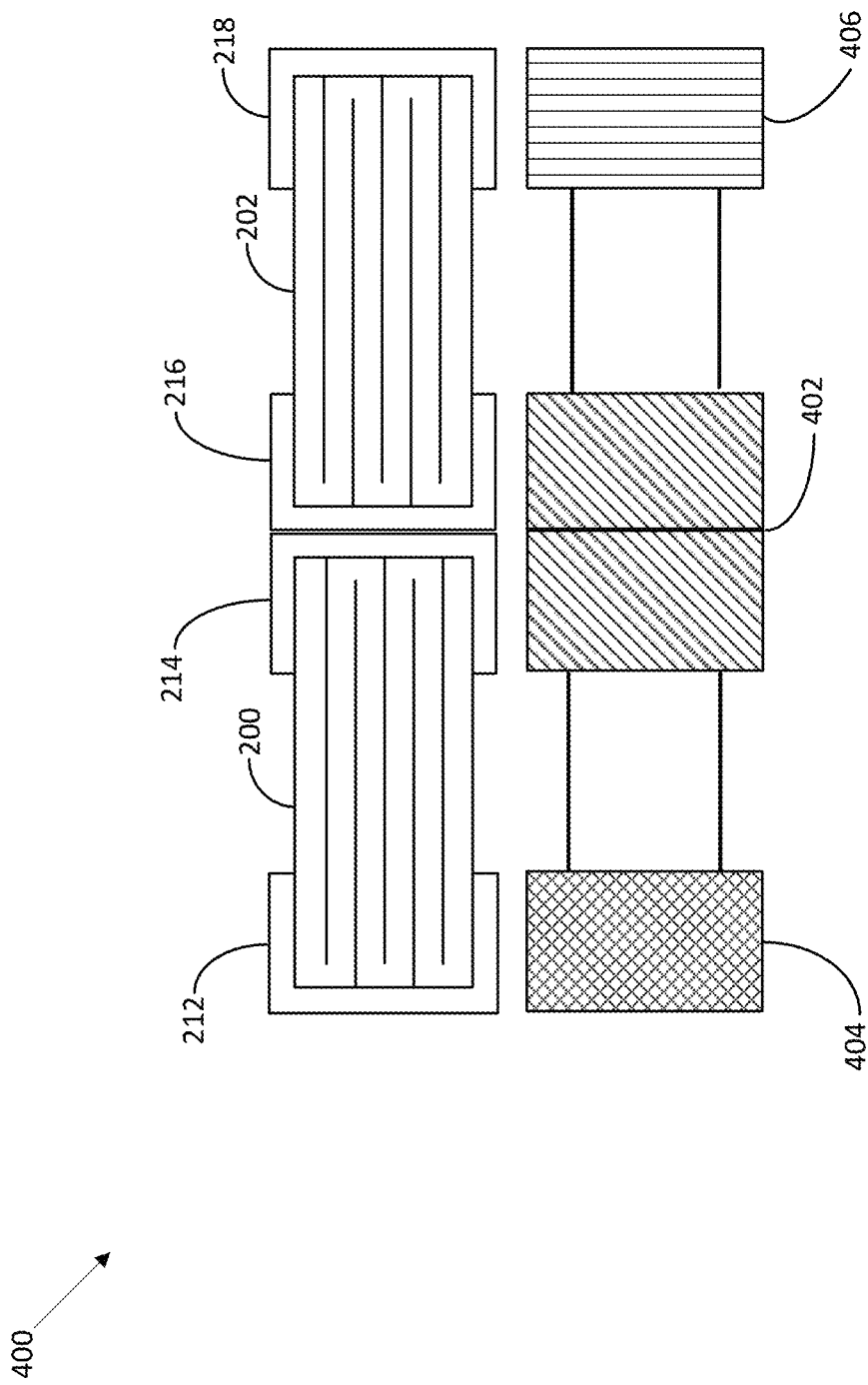
FIG. 4 is a top down view of a combine contact pad structure, according to some embodiments.

In some applications, two or more passive components, such as surface mount passive components 200, 202, may share a common signal point. Turning now to FIG. 3, a schematic representation of the surface mount passive components 200, 202 is shown, according some embodiments. As shown in FIG. 3, both the surface mount passive component 200 and the surface mount passive component 202 share a common signal point at Vref. In certain applications where there is a shared signal for two or more adjacent passive components, such as surface mount passive components 200, 202, a common contact pad may be formed on a printed circuit board or other substrate to form a common signal pad. Turning now to FIG. 4, a combined contact pad structure 400 is shown, according to some embodiments. The combined contact pad structure 400 may include an individual common signal pad 402, as well as single contact pads 404, 406. In one example, the common signal pad 402 may just be a connection formed between separate pads, such as component pads 214, 216 described above. This design allows for components, such as surface mount passive components 200, 202 to share a common signal pad 402 to eliminate the spacing between the pads sharing a common signal (such as between component pads 214, 216).

While the spacing requirements between pads is eliminated in the combined pad structure 400, other issues may occur during production, as production equipment cannot determine a signal difference between the pads that make up the common signal pad 402. Additionally, due to component density and space constraints, current placement devices may be unable to place multiple components on the same pad as interference may occur between the placement device and/or the component to be placed and existing components, resulting in a process failure.

Figure 5:
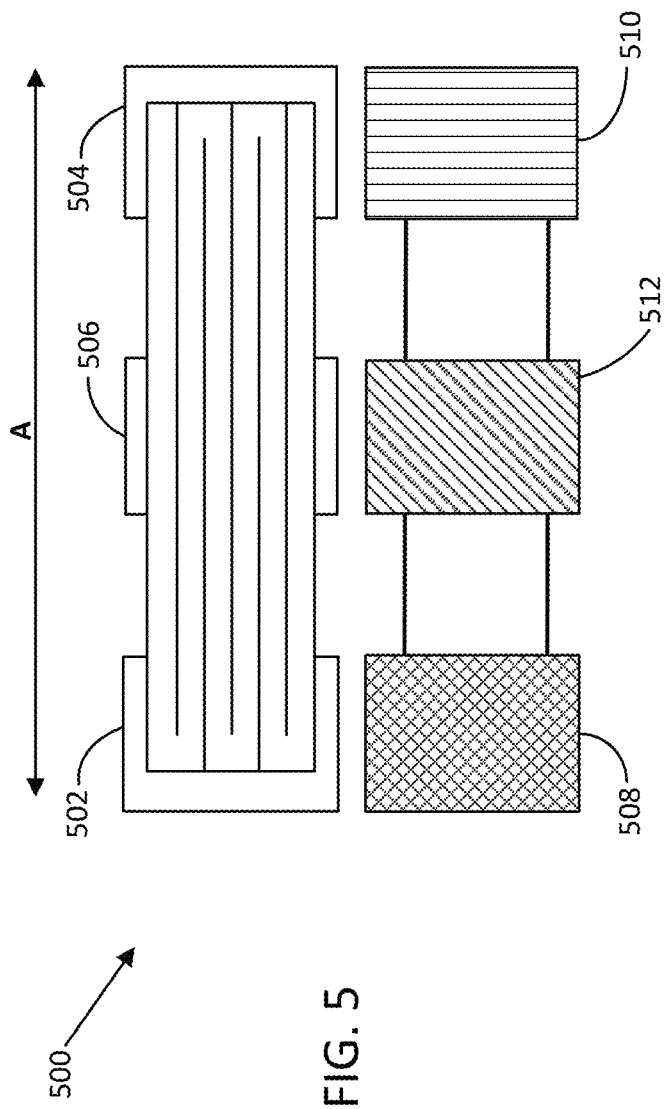
FIG. 5 is a top view of a multi-component passive surface mount component, according to some embodiments.

Turning now to FIG. 5, a multi-component passive surface mount component 500 is shown, according to some embodiments. The multi-component passive surface mount component 500, in some embodiments, may include one or more resistors. In other examples, the multi-component passive surface mount component 500 may include other passive components, such as inductors and/or capacitors. The multi-component passive surface mount component 500 may include a first connection terminal 502, a second connection terminal 504, and a common signal terminal 506. The first connection terminal 502, the second connection terminal 504, and the common signal terminal 506 of the multi-component passive surface mount component 500 may be configured to be coupled to corresponding connection pads 508, 510, 512 (respectively), which may be located on a printed circuit board or other substrate as described above. For example, the common signal terminal 506 may be configured to couple to the connection pad 512, to allow for a common connection measurement to be made. In one embodiment, the common signal terminal 506 may be located equidistant between the first connection terminal 502 and the second connection terminal 504 along a longitudinal axis A. In some examples, the multi-component passive surface mount component 500 is configured to be used within a data storage device, such as the data storage device 102 described above.

Figure 6:
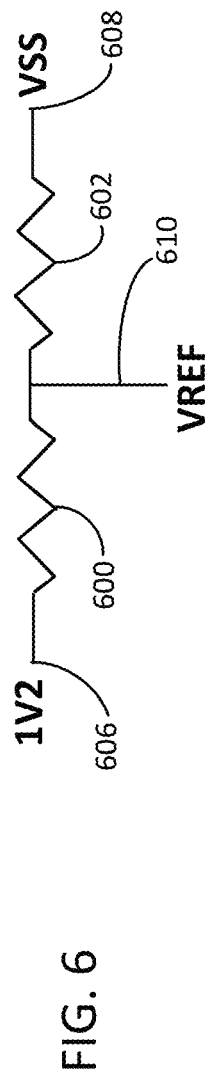
FIG. 6 is a schematic view of the multi-component passive surface mount component of FIG. 5, according to some embodiments, according to some embodiments.

Turning now to FIG. 6, a schematic diagram of the multi-component passive surface mount component 500 is shown, according to some embodiments. As shown in FIG. 6, the multi-component passive surface mount component 500 includes a first resistor 600 and a second resistor 602. As shown in FIG. 6, the first resistor 600 and the second resistor 602 are configured in a series arrangement between a first signal 606 and a second signal 608. In some embodiments, the first signal 606 and the second signal 608 are different voltage potentials. A common reference signal 610 is provided at the junction of the first resistor 600 and the second resistor 602. In some embodiments, the common reference signal 610 may be determined based on the impedance values of the first resistor 600 and the second resistor 602, as well as the first signal 606 and the second signal 608. In other embodiments, the common reference signal 610 may be an input signal, thereby resulting in the first signal 606 and the second signal 608 being determined based on the common reference signal 610, the first resistor 600 impedance and the second resistor 602 impedance. In some embodiments, the first resistor 600 and the second resistor 602 have the same impedance. However, in other embodiments, the first resistor 600 and the second resistor 602 may have different impedance values. In some examples, a data storage device, such as data storage device 102 described above, may include from 5-50 multi-component passive surface mount components. However, less than 5 multi-component passive surface mount components and more than 50 multi-component passive surface mount components are also contemplated as appropriate for a given application.

Figure 7:
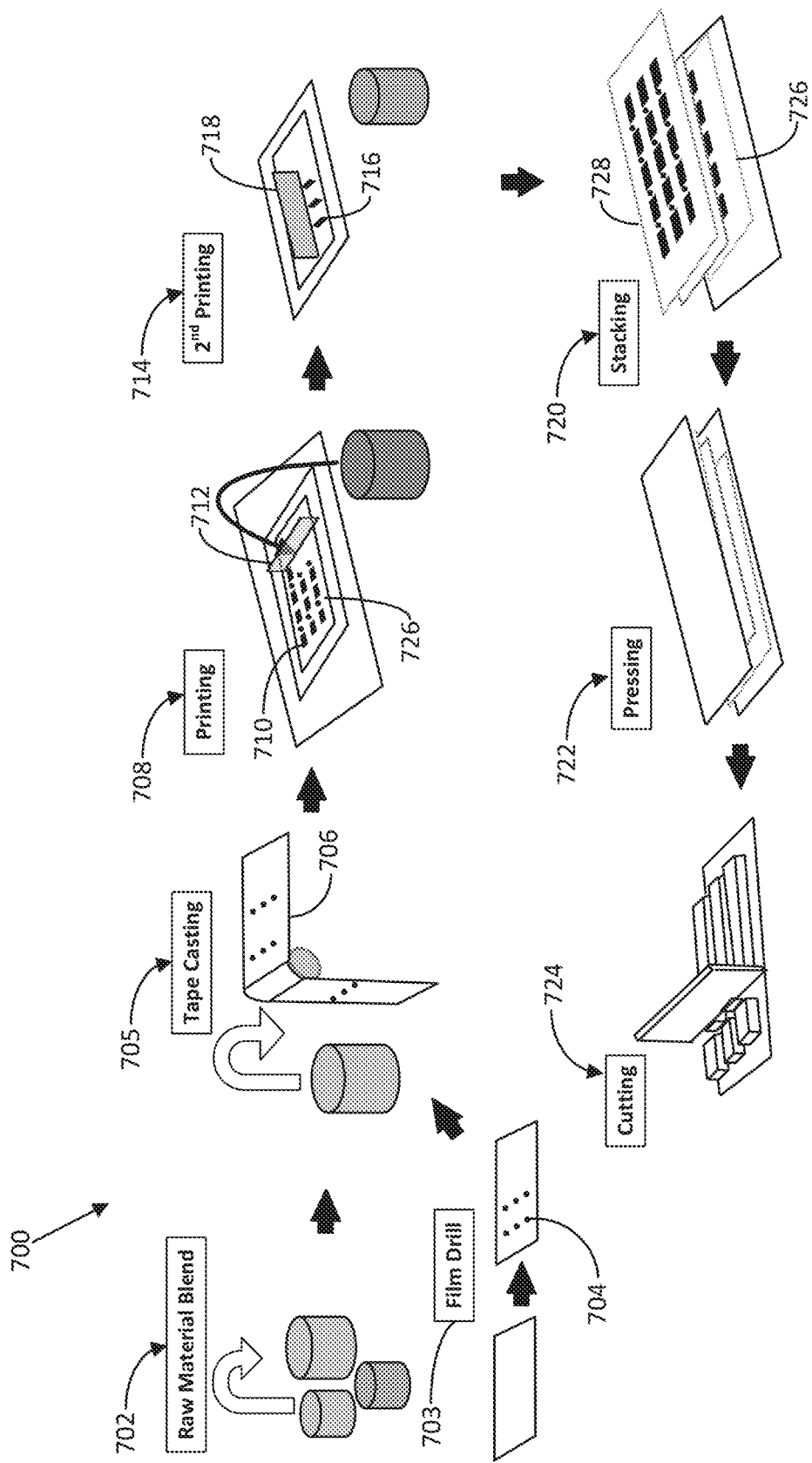
FIG. 7 is a process chart illustrating a fabrication process for manufacturing the multi-component passive surface mount component of FIG. 5, according to some embodiments.

Turning now to FIG. 7, a fabrication process 700 for manufacturing a multi-component passive surface mount component, such as multi-component passive surface mount component 500, is shown according to some embodiments. A blending process 702 blends raw materials to create the materials needed to create the desired passive components. In one embodiment, the raw materials, and the resulting material products are standard materials as known in the art. Further, the process for blending the raw materials is known in the art for the given type of passive component. A film drill process 703 is performed to drill one or more holes or vias 704 into a thin film. The one or more holes or vias may be used to allow for interconnections between individual film layers that accommodate a terminal not positioned at the end of a component, such as the common signal terminal 506, described above.

One or more tape casting processes 705 are performed to create one or more ceramic tapes and/or sheets 706. In one embodiment, the ceramic tape and/or sheets 706 are formed from applying a ceramic slurry to the individual film layers described above. The tape casting processes 705 may cast the ceramic slurry in a thin layer onto a surface of the individual film layers to be dried and sintered in order to create the ceramic tape and/or sheets 706. The ceramic tape and/or sheets 706 may be used as a base material for a passive component, such as a resistor, capacitor, inductor, etc. A first printing process 708 is performed to print a first mask 710 onto a substrate, which may be formed onto the ceramic tape and/or sheet 706 described above. In one embodiment, the first mask 710 is used to print the passive component body. In one embodiment, the first mask 710 is applied using a thin film deposition process. For example, the first mask 710 may be applied using a plasma assisted chemical vapor deposition (PCVD) process, and/or a sputtering method.

The first printing process 708 may also apply a first electrode paste 712 to the first mask 710. The first electrode paste 712 may be a conductive paste for creating the component body (e.g. the passive component) In one embodiment, the first electrode paste 712 is spread across the first mask 710 using various methods. In one example, the first electrode paste 712 is spread across the first mask 710 using a squeegee. The first electrode paste 712 may then be set using a setting process, such as dry firing. After the first electrode paste 712 is set, the set material may then be trimmed, such as using laser trimming. In one embodiment, the electrode paste may include a nickel material, a copper material, or a combination of materials including the nickel material and the copper material.

A second printing process 714 is performed to print a second mask 716 onto the substrate. In one embodiment, the second mask 716 is used to print the common signal terminal, such as the common signal terminal 506 described above. In some examples, the second mask 716 may be applied using a thin film deposition process, as described above. However, other processes may be used to apply the second mask 716.

The second printing process 714 may also apply a second electrode paste 718 to the second mask 716. The second electrode paste 718 may be a conductive paste for creating one or more terminals or conductive pads, such as the common signal terminal 506, described above. In one embodiment, the second electrode paste 718 is spread across the second mask 716 using various methods. In one example, the second electrode paste 718 is spread across the second mask 716 using a squeegee. The second electrode paste 718 may then be set using a setting process, such as dry firing. After the second electrode paste 718 is set, the set material may then be trimmed, such as using laser trimming. The first printing process 708 and the second printing process 714 may be performed on multiple substrates, such as the ceramic tapes and/or sheets 706 described above. In one embodiment, the first printing process 708 and the second printing process 714 may be performed to produce multiple layers, wherein each layer is a portion of the multi-component passive surface mount component 500.

A stacking process 720 is then performed to stack multiple component layers 726, 728 together. In one embodiment, each stacking layer 726, 728 has been generated using the first printing process 708 and the second printing process 714 described above. However, other layers with other printing processes may also be stacked at stacking process 720. In one embodiment, the stacking process 720 stacks 50 layers. In other embodiments, the stacking process 720 may stack 100 layers. However, stacking more or less than 50 layers, or more or less than 100 layers is also contemplated as appropriate for a given application. A pressing process 722 is then performed to press the stacked layers together to form one or more components. The pressing process 722 may be a standard surface mount component pressing process. A cutting process 724 is then performed to separate the completed components from the substrate. Further fabrication processes may then be performed to complete the components, such as firing, tumbling and plating processes, as are known in the art.

Figure 8:
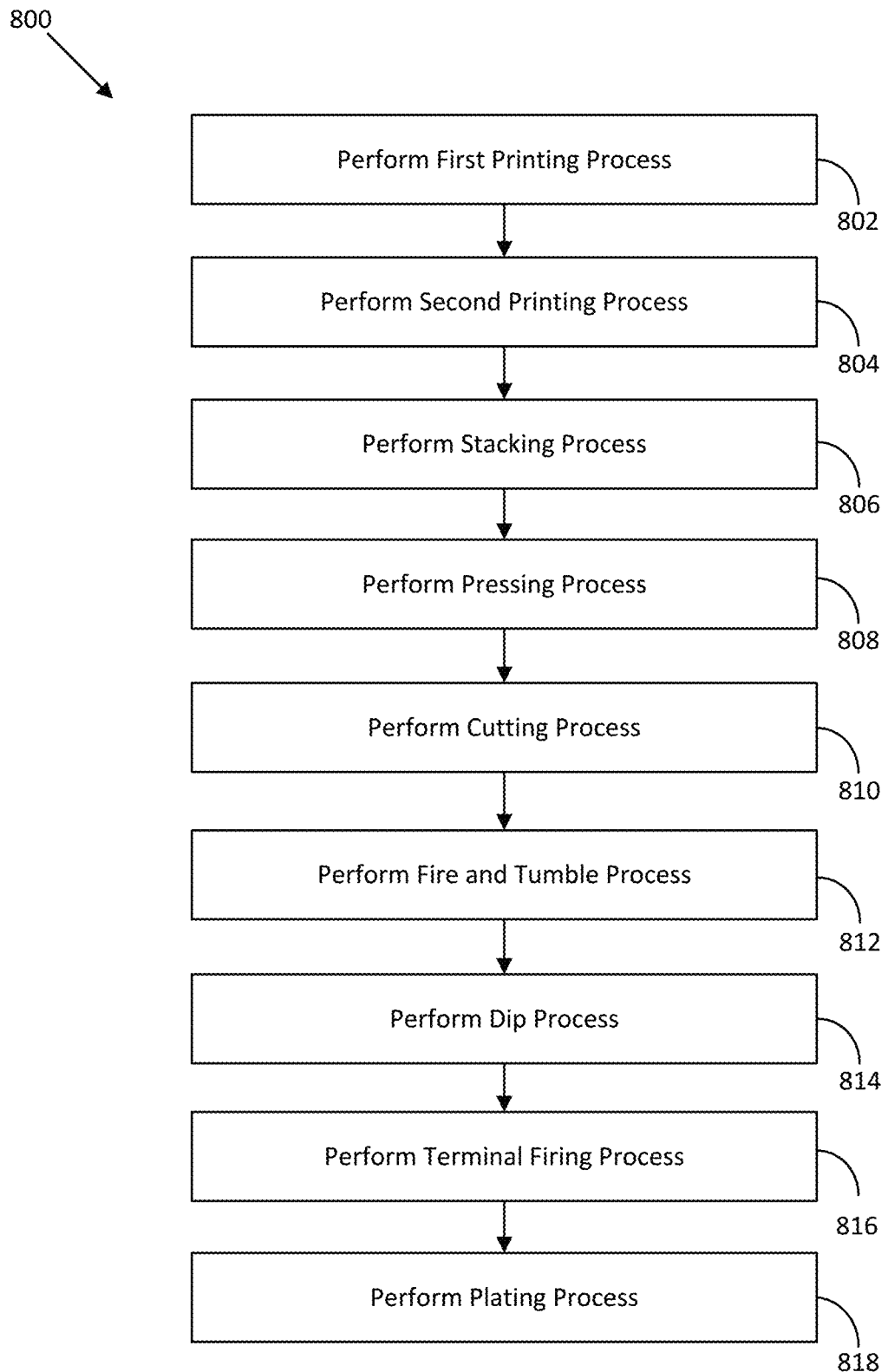
FIG. 8 is a flow chart illustrating a process for fabricating the multi-component passive surface mount component of FIG. 5, according to some embodiments.

Turning now to FIG. 8, a process 800 for fabricating a multi-component passive surface mount component, such as multi-component passive surface mount component 500, is shown according to some embodiments. At block 802, a first printing process is performed to form at least a portion of the body of the multi-component passive surface mount component 500, as described above. In some embodiments, the first printing process may be similar to the first printing process 708, described above. At block 804, a second printing process is performed to form one or more additional terminations of the multi-component passive surface mount component 500, as described above. In one embodiment, the second printing process may be similar to the second printing process 714, described above. At block 806, a stacking process may be performed to stack one or more component layers together. In one embodiment, the stacking process is similar to the stacking process 720 described above. At block 808, a pressing process is performed to combine the stacked layers. In some embodiments, the pressing process may be similar to the pressing process 722 described above. In other examples, the pressing process may require more heat and/or pressure than a normal pressing process to ensure the connections to the common signal terminal 506 are properly stacked.

At block 810, a cutting process is performed to separate components formed during the pressing process. In one embodiment, the cutting process may be similar to the cutting process 724 described above. At block 812, a fire and tumble process is performed to cure the components as well as to the remove any rough edges, according to some embodiments. At block 814, a dipping process is performed to form terminations on the components. In one embodiment, the dipping process allows a conductive material to be coupled to exposed portions of the components to allow for external electrical connections to be made. At block 816, a termination firing process is performed to cure the terminals created during the dipping process, according to some embodiments. At block 818 a plating process is performed to plate the terminals to allow for the component to be connected to one or more contact pads on a printed circuit board and/or substrate as noted above.

With regard to the processes, systems, methods, heuristics, etc. described herein, it should be understood that, although the steps of such processes, etc. have been described as occurring according to a certain ordered sequence, such processes could be practiced with the described steps performed in an order other than the order described herein. It further should be understood that certain steps could be performed simultaneously, that other steps could be added, or that certain steps described herein could be omitted. In other words, the descriptions of processes herein are provided for the purpose of illustrating certain implementations and should in no way be construed to limit the claims.

Accordingly, it is to be understood that the above description is intended to be illustrative and not restrictive. Many embodiments and applications other than the examples provided would be apparent upon reading the above description. The scope should be determined, not with reference to the above description, but should instead be determined with reference to the appended claims, along with the full scope of equivalents to which such claims are entitled. It is anticipated and intended that future developments will occur in the technologies discussed herein, and that the disclosed systems and methods will be incorporated into such future embodiments. In sum, it should be understood that the application is capable of modification and variation.

All terms used in the claims are intended to be given their broadest reasonable constructions and their ordinary meanings as understood by those knowledgeable in the technologies described herein unless an explicit indication to the contrary in made herein. In particular, use of the singular articles such as "a," "the," "said," etc. should be read to recite one or more of the indicated elements unless a claim recites an explicit limitation to the contrary.

The Abstract is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separately claimed subject matter.

What is claimed is:

1. A method for manufacturing a multiple passive component package, the method comprising:
    performing a first printing process to print at least a portion of a first passive component and a second passive component on a first layer;
    performing a second printing process to print at least a portion of a common signal terminal between the first passive component and the second passive component on the first layer,
    wherein the common signal terminal provides a common connection point between the first passive component and the second passive component;
    repeating the first printing process and the second printing process for a plurality of layers, wherein each of the plurality of layers is an individual ceramic sheet;
    performing a stacking operation to stack the plurality of layers;
    performing a pressing operation to combine the plurality of layers; and
    separating one or more of the combined plurality of layers,
    wherein each of the first printing process and the second printing process is a plasma assisted chemical vapor deposition process.

2. The method of claim 1, wherein the multiple passive component package includes at least two passive components.

3. The method of claim 2, wherein the first passive component and the second passive component are resistors.

4. The method of claim 2, further comprising performing a drilling process on at least a portion of the first layer, wherein the drilling process drills one or more holes in the first layer corresponding to a location of a common terminal point.

5. The method of claim 4, wherein the common terminal point is positioned equidistant between a first connection terminal of the first passive component and a second connection terminal of the second passive component.

* * * * *